United States Patent
Fu et al.

(10) Patent No.: US 12,218,682 B2
(45) Date of Patent: Feb. 4, 2025

(54) ENCODING METHOD, DECODING METHOD, ELECTRONIC DEVICE AND STORAGE MEDIUM

(71) Applicant: Shenzhen Research Institute of Big Data, Shenzhen (CN)

(72) Inventors: Ximing Fu, Shenzhen (CN); Shenghao Yang, Shenzhen (CN)

(73) Assignee: Shenzhen Research Institute of Big Data, Guangdong (CN)

( * ) Notice: Subject to any disclaimer, the term of this patent is extended or adjusted under 35 U.S.C. 154(b) by 0 days.

(21) Appl. No.: 18/251,659

(22) PCT Filed: May 20, 2021

(86) PCT No.: PCT/CN2021/094975
§ 371 (c)(1),
(2) Date: May 3, 2023

(87) PCT Pub. No.: WO2022/110691
PCT Pub. Date: Jun. 2, 2022

(65) Prior Publication Data
US 2024/0048157 A1 Feb. 8, 2024

(30) Foreign Application Priority Data

Nov. 24, 2020 (CN) .......................... 202011325637.X

(51) Int. Cl.
*H03M 13/11* (2006.01)
*H03M 13/03* (2006.01)

(52) U.S. Cl.
CPC ...... *H03M 13/1114* (2013.01); *H03M 13/033* (2013.01); *H03M 13/1174* (2013.01)

(58) Field of Classification Search
CPC ........... H03M 13/1114; H03M 13/033; H03M 13/1174; H03M 13/05; H03M 13/373; H03M 13/616; G06F 11/10
See application file for complete search history.

(56) References Cited

U.S. PATENT DOCUMENTS 11,557,090 B2 *  1/2023  Chi ......................... G06T 11/40
2014/0146916 A1  5/2014  Shattil
(Continued)

FOREIGN PATENT DOCUMENTS

| CN | 101540778 A | 9/2009 |
|---|---|---|
| CN | 107070590 A | 8/2017 |

(Continued)

OTHER PUBLICATIONS

International Search Report for PCT/CN2021/094975 dated Aug. 20, 2021. China National Intellectual Property Administration (ISA/CN), Beijing, China.
Written Opinion of the Searching Authority for PCT/CN2021/094975 dated Aug. 20, 2021. China National Intellectual Property Administration (ISA/CN), Beijing, China.
Bing, Han, "Research on Encoding and Decoding Algorithms for Polar Codes", Xidian University, Jun. 2017, pp. 1-81, published in China.
(Continued)

*Primary Examiner* — Cynthia Britt
(74) *Attorney, Agent, or Firm* — M&B IP Analysts, LLC

(57) ABSTRACT

An encoding method, a decoding method, an electronic device and a storage medium are disclosed. The encoding method includes: acquiring stored data in a storage system, and acquiring nodes corresponding to the stored data to obtain a number of the nodes; dividing the acquired stored data into a sequence of information vectors, and generating an information matrix according to the number of the nodes and a number of the sequence of information vectors; and calculating an encoded block according to each information vector and the information matrix to obtain a sequence of encoded blocks.

15 Claims, 7 Drawing Sheets

(56) References Cited

U.S. PATENT DOCUMENTS

2016/0350188 A1* 12/2016 Song .................. G06F 3/0619
2017/0046227 A1    2/2017 Fan et al.
2019/0341936 A1   11/2019 Lin et al.
2020/0099399 A1*  3/2020 Xie .................... H04W 72/23

FOREIGN PATENT DOCUMENTS

| CN | 108279995 A  | 7/2018  |
|----|--------------|---------|
| CN | 109802687 A  | 5/2019  |
| CN | 110311689 A  | 10/2019 |
| CN | 110457161 A  | 11/2019 |
| CN | 110535558 A  | 12/2019 |
| CN | 110730003 A  | 1/2020  |
| CN | 111404558 A  | 7/2020  |
| CN | 111447044 A  | 7/2020  |
| CN | 112532252 A  | 3/2021  |
| EP | 3567732 A1   | 11/2019 |
| KR | 101618269 B1 | 5/2016  |
| WO | 2018219195 A1| 12/2018 |

OTHER PUBLICATIONS

Chinese First Search for CN 202011325637.X, dated May 25, 2023. China National Intellectual Property Administration, Beijing, China.

Chinese Office Action for CN 202011325637.X, dated May 30, 2023. China National Intellectual Property Administration, Beijing, China.

Chinese Supplementary Search Report for CN 202011325637.X, dated Oct. 23, 2023. China National Intellectual Property Administration, Beijing, China.

Fu, Ximing, Wu, Chenhao, Guo Yuanxin, Yang, Shenghao, "Two-Tone Shift-XOR Storage Codes", 2021 IEEE International Symposium on Information Theory (ISIT), pp. 1-6.

Fu, Ximing, Yang, Shenghao, Member, IEEE, Xiao Zhiqing, "Decoding and Repair Schemes for Shift-XOR Regenerating Codes", IEEE Transactions on Information Theory, Dec. 2020, vol. 66, No. 12.

Sung, Chi Wan, Gong, Xueqing, "A ZigZag-Decodable Code with the MDS Property for Distributed Storage Systems", 2013 IEEE International Symposium on Information Theory, pp. 341-345.

* cited by examiner

ID, DECODING METHOD, ELECTRONIC DEVICE AND STORAGE MEDIUM

ENCODING METHOD, DECODING METHOD, ELECTRONIC DEVICE AND STORAGE MEDIUM

CROSS-REFERENCE TO RELATED APPLICATIONS

This application is a national stage filing under 35 U.S.C. § 371 of international application number PCT/CN2021/094975, filed May 20, 2021, which claims priority to Chinese patent application No. 202011325637.X filed Nov. 24, 2020. The contents of these applications are incorporated herein by reference in their entirety.

TECHNICAL FIELD

The present application relates to the technical field of encoding and decoding, in particular, to an encoding method, a decoding method, an electronic device and a storage medium.

BACKGROUND

There are currently many encoding and decoding schemes, such as a Reed-Solomon code (RS code) encoding and decoding scheme or a maximum distance separable code (MDS) encoding or decoding scheme based on an exclusive OR (XOR) operation. The RS code encoding and decoding scheme serves as an encoding scheme for many existing systems, but its encoding and decoding operations, as finite field operations, are high in encoding and decoding complexity. In the MDS encoding and decoding scheme based on the XOR operation, information stored by each node has redundancy. As the number of the nodes in a network increases, the storage redundancy increases, especially when the code is non-systematic.

SUMMARY

The present application aims to solve one of the technical problems in the existing technology. To this end, the present application provides an encoding method, a decoding method, an electronic device and a storage medium, thus reducing the storage redundancy of each node, reducing the computational complexity in encoding and decoding, and also reducing the space overhead for encoding and decoding.

An encoding method according to the embodiments in a first aspect of the present application includes:
  acquiring stored data in a storage system;
  acquiring nodes corresponding to the stored data to obtain a number of the nodes;
  dividing the stored data into a sequence of information vectors;
  generating an information matrix according to the number of the nodes and a number of the information vectors; and
  calculating an encoded block according to each information vector and the information matrix to obtain a sequence of encoded blocks.

The encoding method according to the embodiments of the present application at least has the following beneficial effects.

The encoding method includes acquiring stored data in a storage system, acquiring nodes corresponding to the stored data to obtain the number of the nodes; dividing the acquired stored data into a sequence of information vectors, generating an information matrix according to the number of the nodes and a number of the sequence of information vectors, and calculating an encoded block according to each information vector and the information matrix to obtain a sequence of encoded blocks, thereby completing the encoding. This encoding scheme reduces the computational complexity and the storage overhead.

According to some embodiments of the present application, the information matrix includes a multi-order first matrix; and correspondingly, the generating an information vector according to the number of the nodes and a number of the information vectors includes:
  generating the multi-order first matrix according to the number of the nodes and the number of the information vectors.

According to some embodiments of the present application, the information matrix includes a multi-order first matrix; and correspondingly, the calculating an encoded block according to each information vector and the information matrix to obtain a sequence of encoded blocks includes:
  calculating an encoded block by multiplying each information vector with the first matrix to obtain the sequence of encoded blocks.

According to some embodiments of the present application, the information matrix includes a multi-order second matrix; and correspondingly, the generating an information vector according to the number of the nodes and the number of the information vectors includes:
  generating a multi-order identity matrix according to the number of the sequence of information vectors;
  generating a multi-order third matrix according to the number of the nodes and the number of the information vectors; and
  compounding the identity matrix and the third matrix to generate the multi-order second matrix.

According to some embodiments of the present application, the information matrix includes a multi-order second matrix; and correspondingly, the calculating an encoded block according to each information vector and the information matrix to obtain a sequence of encoded blocks includes:
  calculating an encoded block by multiplying each information vector with the second matrix to obtain the sequence of encoded blocks.

A decoding method according to the embodiments in a second aspect of the present application includes:
  acquiring a sequence of encoded blocks and a sequence of connection nodes, where the encoded blocks are the encoded blocks calculated by the encoding method according to any one of the embodiments in the first aspect of the present application;
  acquiring an encoded block corresponding to each connection node to obtain the sequence of encoded blocks;
  generating a decoding block according to each connection node and each encoded block to obtain a sequence of decoding blocks; and
  performing bitonic decoding on each decoding block to generate the information vectors.

The decoding method according to the embodiments of the present application at least has the following beneficial effects.

The decoding method includes acquiring the sequence of encoded blocks and the sequence of connection nodes calculated according to the embodiments in the first aspect of the present application, acquiring each encoded block corresponding to each connection node, generating each decoding block, and performing bitonic decoding on the decoding blocks to generate the information vectors, thereby completing the decoding. This decoding scheme reduces the computational complexity and the space overhead for decoding.

According to some embodiments of the present application, the connection nodes include node sequence numbers; and the generating a decoding block according to each connection node and each encoded block to obtain a sequence of decoding blocks includes:

sorting the sequence of connection nodes according to the node sequence numbers to obtain a sequence of sorted nodes; and generating decoding blocks according to the sequence numbers of the sequence of sorted nodes and the encoded blocks corresponding to the sorted nodes.

According to some embodiments of the present application, the generating a decoding block according to each connection node and each encoded block to obtain a sequence of decoding blocks includes:

transmitting each encoded block corresponding to each connection node to a user side; and acquiring a sequence of decoding blocks which are generated by the user side according to each encoded block corresponding to each connection node.

According to some embodiments of the present application, the connection nodes include node sequence numbers; each connection node includes a message node and a check node; each decoding block includes each encoded block corresponding to each message node and each check block corresponding to each check node; and correspondingly, the generating a decoding block according to each connection node and each encoded block to obtain a sequence of decoding blocks includes:

sorting the sequence of connection nodes according to the node sequence numbers to obtain a sequence of sorted nodes;

acquiring each encoded block corresponding to each message node;

generating a check block from each encoded block corresponding to each check node according to the sequence numbers of the sequence of check nodes in the sequence of sorted nodes; and transmitting each decoding block to the user side, and acquiring each new decoding block which is generated after the user side performs a local decoding operation according to each decoding block.

According to some embodiments of the present application, each connection node includes a message node and a check node; each decoding block includes each encoded block corresponding to each message node and each check block corresponding to each check node; and correspondingly, the generating a decoding block according to each connection node and each encoded block to obtain a sequence of decoding blocks includes:

transmitting each encoded block corresponding to each connection node to the user side, and generating, by the user side, a decoding block from each encoded block corresponding to each check node according to each check node; and acquiring each new decoding block which is generated after the user side performs a local decoding operation according to each encoded block.

According to some embodiments of the present application, each decoding block includes each encoded block corresponding to each message node and each check block corresponding to each check node; and correspondingly, the generating each new decoding block by the user side by performing a local decoding operation according to each decoding block includes:

performing, according to each encoded block corresponding to each message node, an XOR operation on each check block and each encoding bit, corresponding to each message node, in each encoded block, to generate each new decoding block.

An electronic device according to the embodiments in a third aspect of the present application includes:

a memory, a processor, and a computer program that is stored in the memory and executable on the processor, where the processor is configured to implement the encoding method according to any one of the embodiments in the first aspect of the present application or the decoding method according to any one of the embodiments in the second aspect of the present application when executing the computer program.

The electronic device according to the embodiments of the present application at least has the following beneficial effects. The encoding method according to the embodiments in the first aspect is performed to acquire stored data in a storage system, acquire nodes corresponding to the stored data to obtain the number of the nodes, divide the acquired stored data into a sequence of information vectors, generate an information matrix according to the number of the nodes and a number of the sequence of information vectors, and calculate an encoded block according to each information vector and the information matrix to obtain a sequence of encoded blocks, thereby completing the encoding. This encoding scheme reduces the computational complexity and the storage overhead. The decoding method according to the embodiments in the second aspect is performed to acquire the sequence of encoded blocks and the sequence of connection nodes calculated according to the embodiments in the first aspect of the present application, acquire each encoded block corresponding to each connection node, generate each decoding block, and perform bitonic decoding on the decoding blocks to generate the information vectors, thereby completing the decoding. This decoding scheme reduces the computational complexity and the space overhead for decoding.

A computer-readable storage medium according to the embodiments in a fourth aspect of the present application is provided. The computer-readable storage medium stores a computer-executable instruction, which is used to enable a computer to perform the encoding method according to any one of the embodiments in the first aspect of the present application or the decoding method according to any one of the embodiments in the second aspect of the present application.

The computer-readable storage instruction according to the embodiments of the present application at least has the following beneficial effects. The encoding method according to the embodiments in the first aspect is performed to acquire stored data in a storage system, acquire nodes corresponding to the stored data to obtain the number of the nodes, divide the acquired stored data into a sequence of information vectors, generate an information matrix according to the number of the nodes and a number of the sequence of information vectors, and calculate an encoded block according to each information vector and the information matrix to obtain a sequence of encoded blocks. This encoding scheme reduces the computational complexity and the storage overhead. The decoding method according to the embodiments in the second aspect is performed to acquire the sequence of encoded blocks and the sequence of connection nodes calculated according to the embodiments in the first aspect of the present application, acquire each encoded block corresponding to each connection node, generate each decoding block, and perform bitonic decoding on the decoding blocks to generate the information vectors. This decoding scheme reduces the computational complexity and the space overhead for decoding.

The additional aspects and advantages of the present application will be partially given in the following description, and part will become obvious from the following description, or be learned through the practice of the present application.

BRIEF DESCRIPTION OF DRAWINGS

The present application will be further described below in conjunction with the accompanying drawings and embodiments, in which.

DETAILED DESCRIPTION

Figure 1:
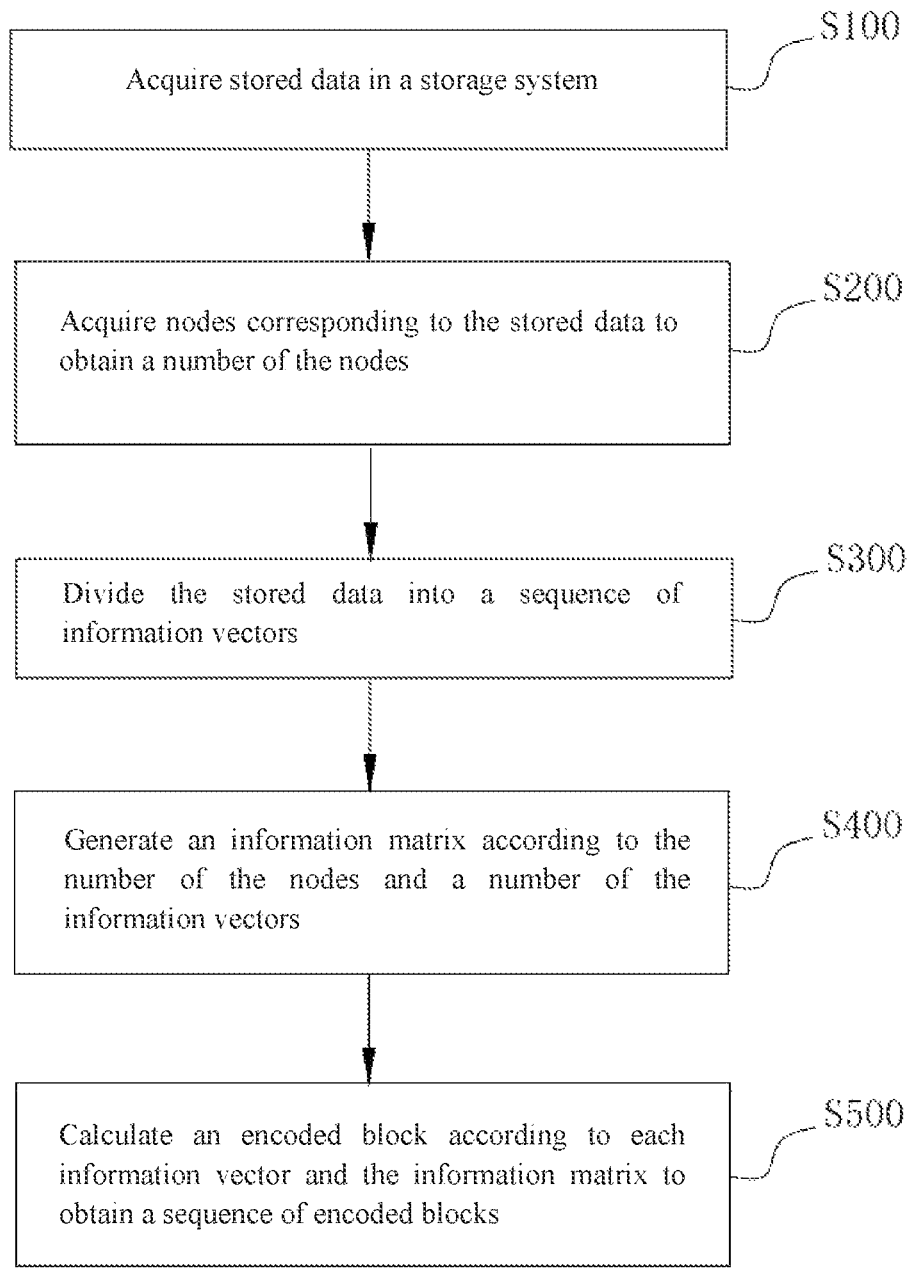
FIG. 1 is a flowchart of an encoding method provided by some embodiments of the present application.

Description will be made in detail to the embodiments of the present application, examples of which are illustrated in the accompanying drawings. The reference numerals which are the same or similar throughout the accompanying drawings represent the same or similar components or components with the same or similar functions. The embodiments described below with reference to the accompanying drawings are exemplary, and are intended to explain the present application, rather than being construed as limitations to the present application.

In the description of the present application, the description with reference to the terms such as "an embodiment", "some embodiments", "exemplary embodiment", "example", "specific example" and "some examples" means that particular features, structures, materials or characteristics described in combination with the embodiments or examples are included in at least one embodiment or example of the present application. In the present description, schematic description of the above terms does not necessarily refer to the same embodiment or example. Furthermore, the described particular features, structures, materials or characteristics can be combined in any one or more embodiments or examples in a proper manner.

There are currently many encoding and decoding schemes, such as an RS code encoding and decoding scheme or an MDS code encoding or decoding scheme based on an XOR operation. The RS code encoding and decoding scheme serves as an encoding scheme for many existing systems, but its encoding and decoding operations, as finite field operations, are high in encoding and decoding complexity. In the MDS encoding and decoding scheme based on the XOR operation, information stored by each node has redundancy. As the number of nodes in a network increases, the storage redundancy increases, resulting in relatively high encoding and decoding complexity.

Based on this, the embodiments of the present application provide an encoding method, a decoding method, an electronic device and a storage medium. The encoding method includes acquiring stored data in a storage system, acquiring nodes corresponding to the stored data to obtain the number of the nodes; dividing the acquired stored data into a sequence of information vectors, generating an information matrix according to the number of the nodes and a number of the sequence of information vectors, and calculating an encoded block according to each information vector and the information matrix to obtain a sequence of encoded blocks, thereby completing the encoding. This encoding scheme reduces the computational complexity and the storage overhead. The decoding method includes acquiring a sequence of encoded blocks and a sequence of connection nodes, acquiring each encoded block corresponding to each connection node, generate each decoding block, and performing bitonic decoding on the decoding blocks to generate information vectors, thereby completing the decoding. This decoding scheme reduces the computational complexity and the space overhead.

In a first aspect, the embodiments of the present application provide an encoding method.

Referring to FIG. 1, FIG. 1 is a flowchart of an encoding method provided by some embodiments of the present application. The encoding method specifically includes the following steps:

S100: acquiring stored data in a storage system;

S200: acquiring nodes corresponding to the stored data to obtain a number of the nodes;

S300: dividing the stored data into a sequence of information vectors;

S400: generating an information matrix according to the number of the nodes and a number of the information vectors; and S500: calculating an encoded block according to each information vector and the information matrix to obtain a sequence of encoded blocks.

In S100, the stored data in the storage system needs to be acquired. The stored data herein refers to a message having a length of kL bits. An encoding operation may be performed according to the acquired stored data.

In S200, the respective nodes of the stored data can be obtained after the stored data is acquired, the nodes corresponding to the stored data are acquired, and the number of the nodes is obtained according to the acquired nodes.

In S300, after the message having the length of kL bits is acquired, this message is divided into k blocks, i.e., into k information vectors, marked as $x_1, \ldots, x_k$, where each block has a length of L bits.

In S400, the information matrix is generated according to the number of the nodes and the number of the information vectors, where the information matrix is in a form of $\Psi = (z^{t_{i,j}})$, where $t_{i,j}$ is a non-negative integer which may be a specific value provided according to actual conditions.

In some embodiments, the information matrix includes a multi-order first matrix; and correspondingly, S400 includes: generating the multi-order first matrix according to the number of the nodes and the number of the information vectors. In the case of encoding a non-systematic code, the acquired number of nodes is set as n, the number of the information vectors is set as k, and a k×n first matrix $\Psi=(z^{t_{i,j}})$ is generated, where $t_{i,j}$ is a non-negative integer which may be a specific value provided according to actual conditions. The first matrix $\Psi$ is in the following form:

$$\Psi = \begin{pmatrix} z^{t_{1,1}} & z^{t_{1,2}} & \cdots & z^{t_{1,k}} \\ z^{t_{2,1}} & z^{t_{2,2}} z^{t_{2,k}} & \cdots & z^{t_{2,k}} \\ \vdots & \vdots & \ddots & \vdots \\ z^{t_{k,1}} & z^{t_{k,2}} & \cdots & z^{t_{k,k}} \end{pmatrix}.$$

The first matrix $\Psi$ satisfies a bitonic ascending property. That is, for specific d≤k, the following three conditions are satisfied:

(1) for any $1 \leq i_1 < i_2 \leq k$ and $1 \leq j_1 < j_2 \leq k$, $t_{i,j_2} < -t_{i,j_2} < t_{i,j_2} - t_{1_2,j_1}$;
(2) for any $1 \leq i \leq d$ and $1 \leq j_1 < j_2 \leq k$, $t_{i,j_2} - t_{i,j_1} \leq 0$; and
(3) for any $d < i \leq k$ and $1 \leq j_1 < j_2 \leq k$, $t_{i,j_2} - t_{i,j_1} > 0$.

Figure 2:
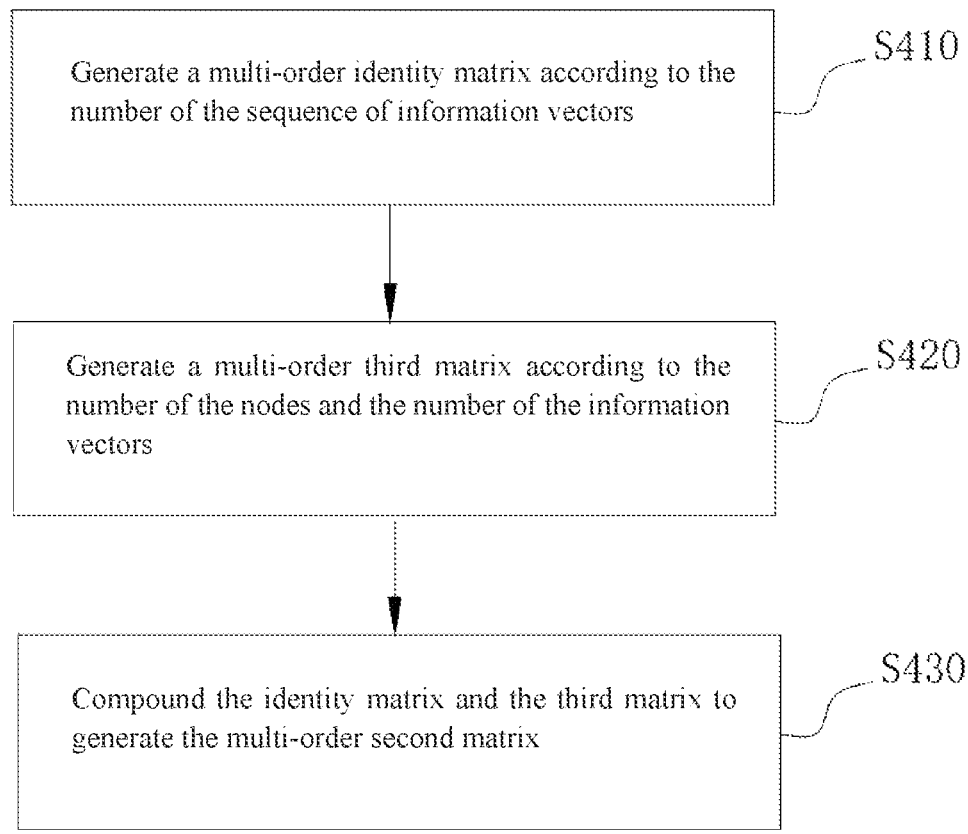
FIG. 2 is a flowchart of an encoding method provided by other embodiments of the present application.

In some embodiments, referring to FIG. 2, S400 specifically includes the following steps:

S410: generating a multi-order identity matrix according to the number of the sequence of information vectors;
S420: generating a multi-order third matrix according to the number of the nodes and the number of the information vectors; and
S430: compounding the identity matrix and the third matrix to generate the multi-order second matrix.

In S410, in the case of encoding a systematic code, the number of the information vectors is set as k, and a k-order identity matrix I is generated according to the number k, where I is an identity matrix of k×k.

In S420, in the case of encoding a systematic code, the acquired number of the nodes is set as n, the number of the information vectors is set as k, and a k×n third matrix $\Phi=(z^{t_{i,j}})$ is generated, where $t_{i,j}$ is a non-negative integer which may be a specific value provided according to actual conditions. The third matrix $\Phi$ also satisfies the bitonic ascending property.

In S430, the identity matrix and the third matrix are compounded to generate the multi-order second matrix. The generated second matrix is used for encoding. The second matrix may be represented as $$\Psi = \begin{pmatrix} I \\ \Phi \end{pmatrix}.$$

In S500, an encoded block is calculated according to each information vector and the information matrix to obtain a sequence of encoded blocks. The encoded blocks are calculated according to the previously acquired information vectors and the constructed information matrix, thereby completing the encoding.

In some embodiments, the information matrix includes a multi-order first matrix; and correspondingly, S500 includes: calculating an encoded block by multiplying each information vector with the first matrix to obtain a sequence of encoded blocks. In the case of encoding a non-systematic code, the number of the information vectors needs to be set as k. k encoded blocks $y_1, \ldots, y_k$ are generated from these k information vectors through the first matrix in the following form:

$$\begin{pmatrix} y_1 \\ y_2 \\ \vdots \\ y_k \end{pmatrix} = \Psi \begin{pmatrix} x_1 \\ x_2 \\ \vdots \\ x_k \end{pmatrix}$$

That is, each encoded encoded block may be obtained according to the following formula (1):

$$y_i = \sum_{j=1}^{k} z t_{i,j} z_j, \ 1 \leq i \leq k, \quad (1)$$

where $z^{t_{i,j}}, x_j$ represents shifting $x_j$ to the right by $t_{i,j}$ units, supplementing $t_{i,j}$ number of zeros before $x_j$, and finally storing the encoded encoded block $y_i$ in a node i.

In some embodiments, the information matrix includes a multi-order second matrix; and correspondingly, S500 includes: calculating an encoded block by multiplying each information vector with the second matrix to obtain a sequence of encoded blocks. In the case of encoding a non-systematic code, the number of information vectors is set as k. k encoded blocks $y_1, \ldots, y_k$ are generated from these k information vectors through the first matrix in the following form:

these k information vectors are encoded into n encoded blocks $y_1, \ldots, y_n$ through a generation matrix as follows:

$$\begin{pmatrix} y_1 \\ y_2 \\ \vdots \\ y_k \end{pmatrix} = \Psi \begin{pmatrix} x_1 \\ x_2 \\ \vdots \\ x_k \end{pmatrix}.$$

That is, each encoded encoded block may be obtained according to the following formula (2):

$$y_i = \begin{cases} x_i, \ 1 \leq i \leq k, \\ \sum_{j=1}^{k} z^{t_{i-k,j}} x_j, \ k < i \leq n, \end{cases} \quad (2)$$

The encoded encoded block $y_i$ is stored in the node i. In a systematic encoding scheme, k encoded blocks $y_1, \ldots, y_k$ are identical with the information vectors $x_1, \ldots, x_k$, and the corresponding nodes are message nodes. The remaining n−k encoded blocks are check blocks, and the corresponding nodes are check nodes. Therefore, in an encoding process of a (n, k) system, only n−k check blocks need to be calculated, and its encoding computational complexity is $$\frac{n-k}{n}$$

of a non-systematic code scheme. In an actual distributed storage system, in order to reduce the storage redundancy, n−k is very small, e.g., a parameter (n=9, k=6) is selected. Then, the encoding calculation overhead of a systematic code is ⅓ of a non-systematic code, such that the calculation overhead is greatly reduced. The maximum additional storage overhead for this encoding scheme is $(n-k-1)(k-1)$ which is lower than traditional schemes.

The encoding method according to the embodiments in the first aspect of the present application includes: acquiring stored data in a storage system, and acquiring nodes corresponding to the stored data to obtain a number of the nodes; dividing the acquired stored data into a sequence of information vectors, and generating an information matrix according to the number of the nodes and a number of the information vectors; and calculating an encoded block according to each information vector and the information matrix to obtain a sequence of encoded blocks. This encoding scheme reduces the computational complexity and the storage overhead.

In a second aspect, the embodiments of the present application provide a decoding method.

Figure 3:
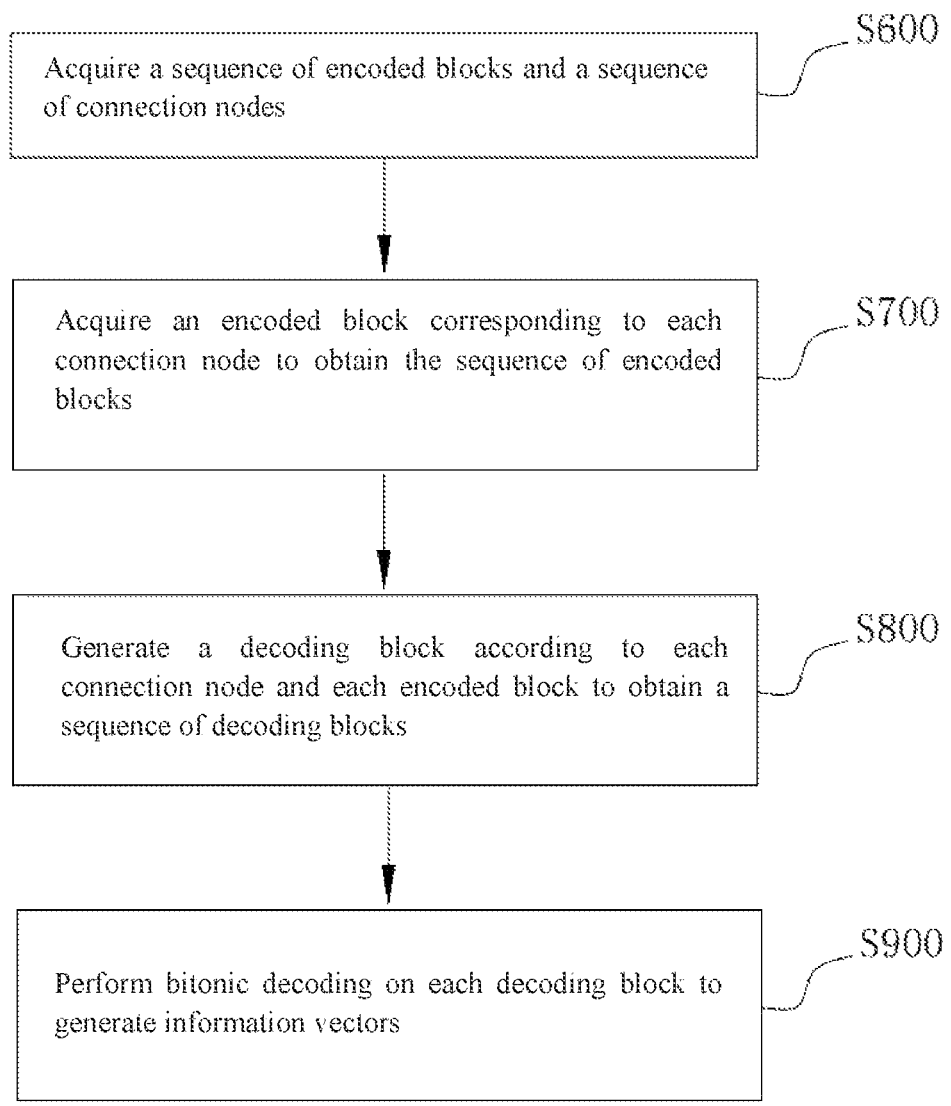
FIG. 3 is a flowchart of a decoding method provided by other embodiments of the present application.

Referring to FIG. 3, FIG. 3 is a flowchart of a decoding method provided by some embodiments of the present application. The decoding method specifically includes the following steps:

S600: acquiring a sequence of encoded blocks and a sequence of connection codes;

S700: acquiring an encoded block corresponding to each connection node to obtain the sequence of encoded blocks;

S800: generating a decoding block according to each connection node and each encoded block to obtain a sequence of decoding blocks; and S900: performing bitonic decoding on each decoding block to generate information vectors.

In S600, the encoded blocks which are encoded according to the embodiments in the first aspect of the present application and the sequence of connection nodes are acquired. In a distributed system, there are n nodes in a network, and data is partitioned into k information vectors, which are then encoded into n encoded blocks and are stored in n nodes respectively. If the data may be restored by any k nodes, this code is an (n,k) MDS code. The decoding method according to the embodiments of the present application is to arbitrarily select k nodes from n nodes to perform a decoding operation on the corresponding encoded blocks corresponding to the respective nodes. Firstly, the sequence of encoded blocks and the sequence of connection nodes need to be acquired; and a decoding operation is performed on the encoded blocks corresponding to the sequence of connection nodes.

In S700, an encoded block corresponding to each connection node is acquired, such that the connection nodes are in one-to-one correspondence to the encoded blocks, thereby facilitating the subsequent decoding operation.

In S800, each connection node corresponds to one encoded block, these encoded blocks are generated into decoding blocks for the convenience of decoding, and these decoding blocks are generated into information vectors.

Figure 4:
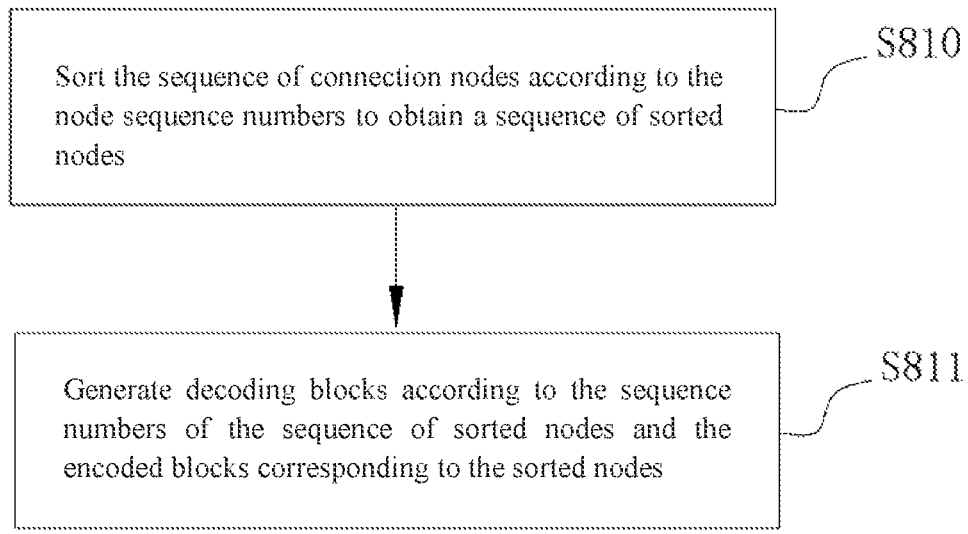
FIG. 4 is a flowchart of a decoding method provided by other embodiments of the present application.

In some embodiments, referring to FIG. 4, S800 specifically includes the following steps:

S810: sorting the sequence of connection nodes according to the node sequence numbers to obtain a sequence of sorted nodes; and S811: generating decoding blocks according to the sequence numbers of the sequence of sorted nodes and the encoded blocks corresponding to the sorted nodes.

In S810, the connection nodes include node sequence numbers. It is assumed that k connection nodes are connected by the user, these k connection nodes are sorted to obtain $i_1 > i_2 > \ldots > i_k$, i.e., k sorted nodes.

Figure 8:
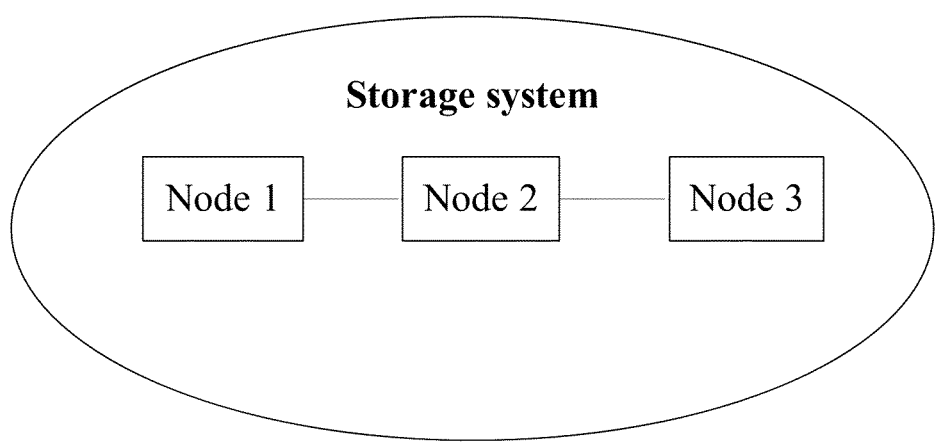
FIG. 8 shows an example of a storage system including a plurality of nodes provided by an embodiment of the present application.

In S811, a node $i_u$ (1≤u≤k) cuts off the encoded block $y_{i_u}$ first, and only a part of $y_{i_u}$ is taken and transmitted to the user. Specifically, $$y_{i_u}[(t_{i_u,u}+1):(t_{i_u,u}+L)]$$

is transmitted to the user, where a value of $t_{i_u,u}$ can be known according to the node $i_u$ in the storage system (as shown in FIG. 8).

$$[(t_{i_u,u}+1):(t_{i_u,u}+L)]$$

is stored in $\hat{x}_u$, i.e., $$\hat{x}_u = y_{i_u}[(t_{i_u,u}+1):(t_{i_u,u}+L)],$$

$\hat{x}_u$ refers to the decoding blocks generated from the sorted node $i_u$ and the encoded block corresponding to the sorted node, where a:b represents a set from a to b, i.e., a,a+1, . . . , b which indicates a null set in a case of a>b. For a data block y, y[a:b] represents a block consisting of a to b bits in Y. The encoded block is partially cut off by sorting to obtain the decoding block, which can reduce the transmission redundancy and improve the efficiency of data transmission. The user may also perform a decoding operation according to the decoding blocks to improve the decoding efficiency.

Figure 5:
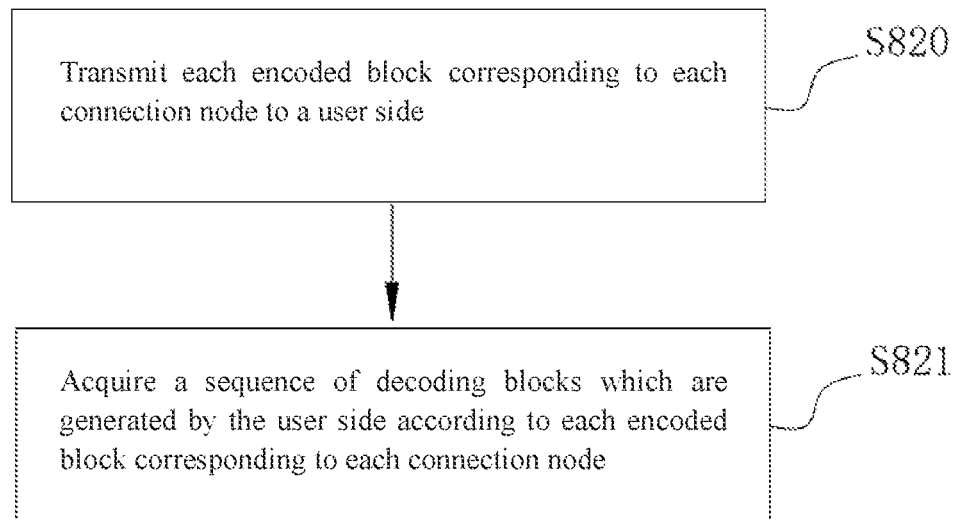
FIG. 5 is a flowchart of a decoding method provided by other embodiments of the present application.

In some embodiments, referring to FIG. 5, S800 specifically includes:

S820: transmitting each encoded block corresponding to each connection node to a user side; and S821: acquiring a sequence of decoding blocks which are generated by the user side according to each encoded block corresponding to each connection node.

In S820, the user may transmit each encoded block corresponding to each connection node directly to the user side according to the connected nodes, without cutting off the encoded block.

In S821, the user side receives the sequence of connection nodes and the sequence of encoded blocks corresponding to the sequence of connection nodes. Since the user knows where the nodes are located, it is not necessary to sort the nodes, and only a part of $$\hat{x}_u = y_{i_u}[(t_{i_u,u}+1):(t_{i_u,u}+L)]$$

is taken and decoded in the case of decoding, where $\hat{x}_u$ refers to a decoding block generated from the node $i_u$ and the encoded block corresponding to the node $i_u$.

Figure 6:
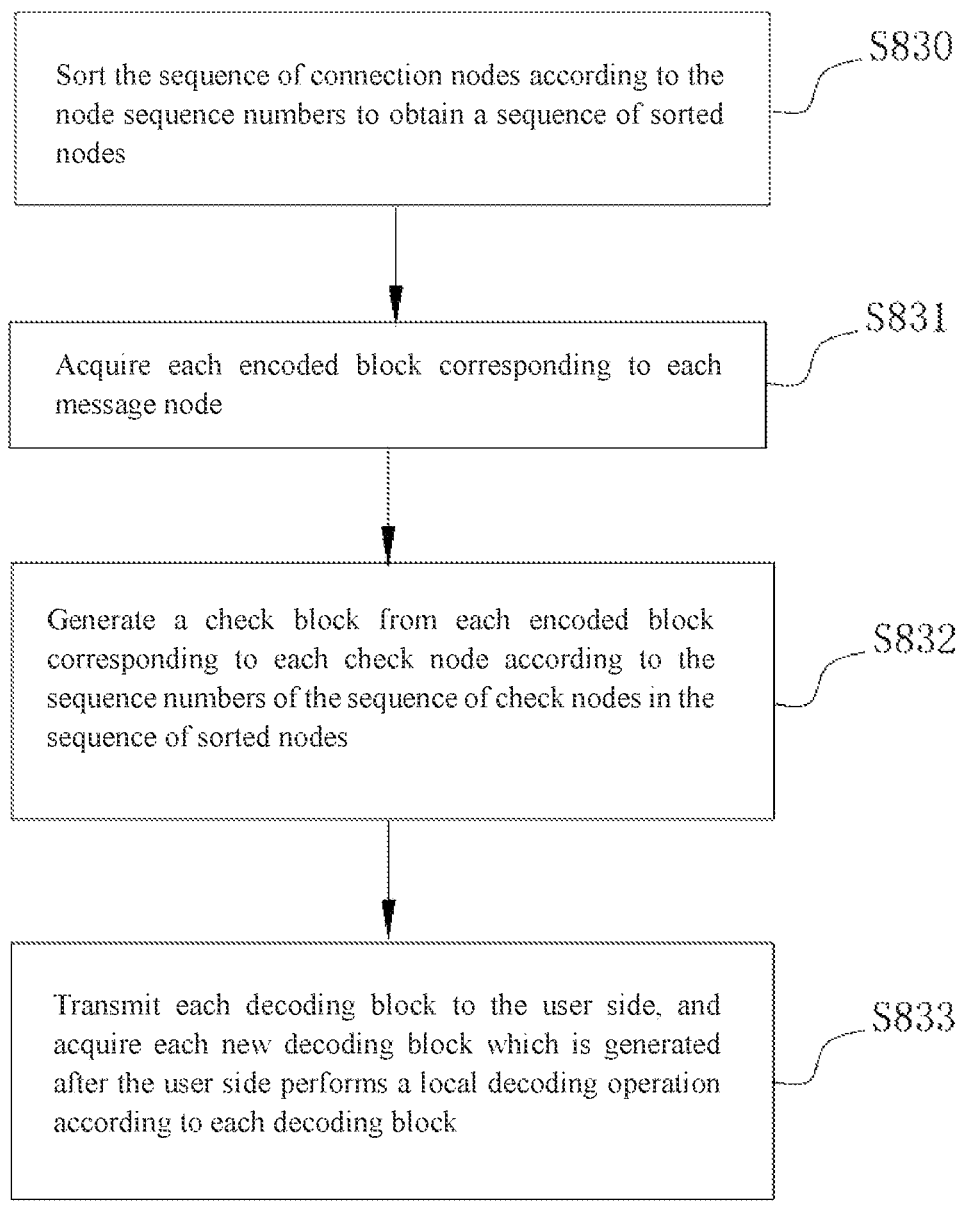
FIG. 6 is a flowchart of a decoding method provided by other embodiments of the present application.

In some embodiments, referring to FIG. 6, S800 specifically includes the following steps:

S830: sorting the sequence of connection nodes according to the node sequence numbers to obtain a sequence of sorted nodes;

S831: acquiring each encoded block corresponding to each message node;

S832: generating a check block from each encoded block corresponding to each check node according to the sequence numbers of the sequence of check nodes in the sequence of sorted nodes; and S833: transmitting each decoding block to the user side, and acquiring each new decoding block which is generated after the user side performs a local decoding operation according to each decoding block.

In some embodiments, the connection nodes include node sequence numbers; each connection node includes a message node and a check node; and each decoding block includes each encoded block corresponding to each message node and each check block corresponding to each check node.

In S830, it is assumed that k connection nodes is connected by a user, these k connection nodes are sorted to obtain $i_1 > i_2 > \ldots > i_k$, i.e., k sorted nodes. These k sorted nodes include $k_m$ message nodes $i_1, \ldots, i_{k_m}$ and $k-k_m$ check nodes $j_1, \ldots, j_{k-k_m}$ and satisfy $j_1 > j_2 > \ldots < j_{k-k_m}$. A set $\Gamma = \{1,2,\ldots,k\} \setminus \{i_1, i_2, \ldots i_{k_m}\}$ is provided, which means that the set $\gamma$ contains $k-k_m=k_p$ elements, marked as $h_1 < h_2 < \ldots < h_{k_p}$.

In S831, each encoded block corresponding to each message node is acquired. That is, an encoded block $y_{i_u}$ corresponding to a node $i_u$ ($1 \le u \le k_m$) is acquired.

In S832, the encoded block corresponding to the node $j_v(1 \le v \le k_p)$ is generated into a check block $\hat{x}_v$. A node $j_v$ cuts off the encoded block corresponding to the node $j_v$ first, and only a part of the encoded block is taken and transmitted to the user. An expression of $\hat{x}_v$ is as follows:

$$\hat{x}_v = y_{j_{i_v}}\left[t_{j_{i_v},h_v} + 1 : t_{j_{i_v},h_v} + L\right].$$

$\hat{x}_v$ is a decoding block which is generated from the node $j_v$ and the encoded block corresponding to the node $j_v$. The encoded block is partially cut off by sorting to obtain the decoding block, which can reduce the transmission redundancy and improve the efficiency of data transmission. The user may also perform a decoding operation according to the decoding blocks to improve the decoding efficiency.

In S833, each decoding block is transmitted to the user side, and each new decoding block which is generated after the user side performs a local decoding operation according to each decoding block is acquired. The decoding blocks herein include an encoded block $y_{t_u}$ corresponding to the node $j_v$, and a check block $\hat{x}_v$ which is generated from the encoded block $y_{i_u}$ corresponding to the node $i_u$, and are then transmitted to the user. The user, after obtaining $y_{i_u}$ ($1 \le u \le k_m$) and $\hat{x}_v$ ($1 \le v \le k_p$), just needs to perform a local decoding algorithm on $\hat{x}_v$ since $y_{i_u} = x_{i_u}$, so as to generate a sequence of new decoding blocks.

In some embodiments, S833 includes: performing, according to each encoded block corresponding to each message node, an XOR operation on each check block and each encoding bit, corresponding to each message node, in the encoded block, to generate each new decoding block. The above step is just the local decoding operation, which includes the following two steps:

for u from 1 to $k_m$, v from 1 to $k_p$, and l from 1 to L; an operation of $$\hat{x}_v[l - t_{i_v,i_u} + t_{i_v,\kappa_v}] \leftarrow \hat{x}_v[l - t_{i_v,i_u} + t_{i_v,\kappa_v}] \oplus y_{i_u}[l]$$

is performed if $$0 < l - t_{i_v,i_u} + t_{i_v,h_v} \le L$$

is satisfied, where $$t_{i_v,i_u}, t_{i_v,h_v} \text{ and } t_{i_v,\kappa_v}$$

are known in the storage system, $\oplus$ represents XOR, and $x \to x \oplus y$ represents a substitution of x with a result of $x \oplus y$.

$$\hat{x}_v[l - t_{i_v,i_u} + t_{i_v,\kappa_v}]$$

which is generated after the above two steps is a new decoding block used for performing a decoding operation. The decoding method is local decoding, which eliminates an extra space overhead for decoding.

Figure 7:
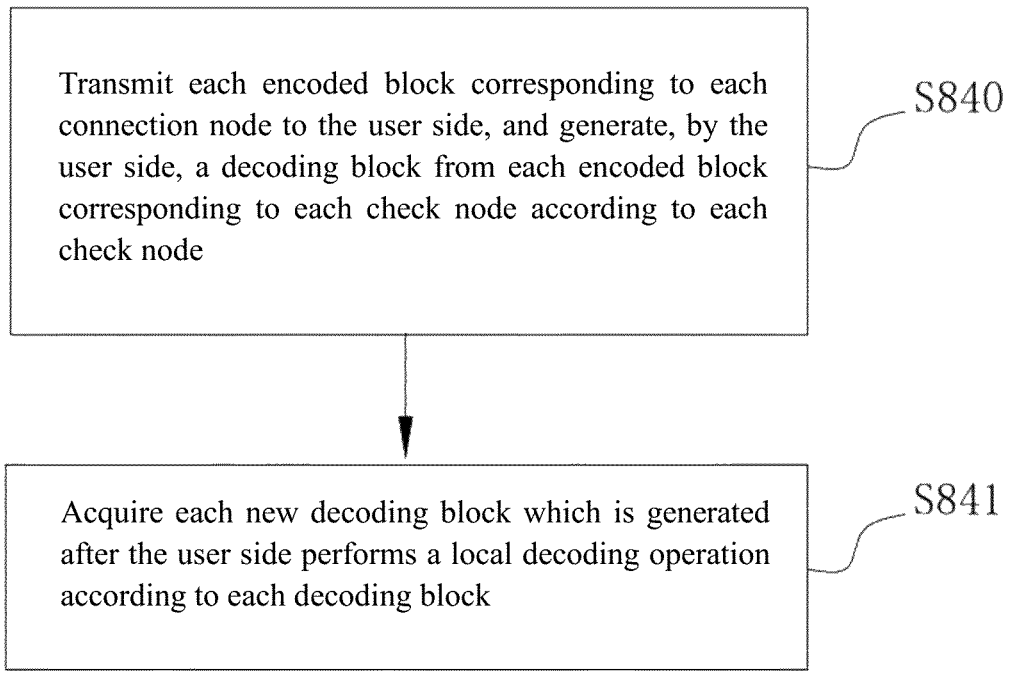
FIG. 7 is a flowchart of a decoding method provided by other embodiments of the present application.

In some embodiments, referring to FIG. 7, S800 specifically includes the following steps:

S840: transmitting each encoded block corresponding to each connection node to the user side, and generating, by the user side, a decoding block from each encoded block corresponding to each check node according to each check node; and S841: acquiring each new decoding block which is generated after the user side performs a local decoding operation according to each decoding block.

In S840, the user transmits each encoded block corresponding to each connection node directly to the user side according to the connected nodes, without cutting off the encoded block, and the user side generates a decoding block from each encoded block corresponding to each check node according to each check node.

In S841, the user side receives the sequence of connection nodes and the sequence of encoded blocks corresponding to the sequence of connection nodes. Since the user knows where the nodes are located, it is not necessary to sort the nodes. Only a part of $$\hat{x}_v = y_{j_{i_v}}\left[t_{j_{i_v},h_v} + 1 : t_{j_{i_v},h_v} + L\right]$$

corresponding to the check node is taken and decoded, where $\hat{x}_v$ refers to a decoding block which is generated from the node $j_v$ and the encoded block corresponding to the node $j_v$.

In some embodiments, S841 includes: performing, according to each encoded block corresponding to each message node, an XOR operation on each check block and each encoding bit, corresponding to each message node, in the encoded block, to generate each new decoding block. This decoding method is local decoding, which eliminates an extra space overhead for decoding.

In S900, bitonic decoding is performed on each decoding block to generate information vectors. In some embodiments, the bitonic decoding algorithm is described as follows.

It is defined that $\hat{x}_u = y_{k+a-u}[(t_{k+1-u,u}+1):(t_{k+1-u,u}+L)]$ $T_i^+ = t_{k-i,i+1} - t_{k-i,i}, 1 \le i < k-d, T_i^- = t_{i+1,i} - t_{i+1,i+1}, 1 \le i \le d$.

Let $T_{i:j}=\Sigma_{u=i}^{j}T_u$, $l^+=0$ and $l^-=0$ are initialized, and a bitonic elimination algorithm is performed on $\hat{x}_u$:

$l^+$ and $l^-$ are initialized as 0, and the following three processes are implemented.

Process One:
- step 1: performing steps 2 to 4 in Process One for $T_b^+$ times for b from 1 to k–d–1;
- step 2: adding 1 to $l^+$, and performing steps 3 to 4 in Process One for u from 1 to b;
- step 3: calculating $l=l^+ - T_{1:u-1}$, and performing step 4 in Process One for v from 1 to k and v≠u; and
- step 4: calculating $\hat{x}_v[t_{k-v+1,k-u+1}-t_{k-v+1,v}+1] \ominus \hat{x}_u[1]$, and substituting $\hat{x}_v[t_{k-v+1,u}-t_{k-v+1,v}+1]$ with the calculation result.

Process Two:
- step 1: performing steps 2 to 4 in Process Two for $T_b^-$ times for b from 1 to d –1;
- step 2: adding 1 to $l^-$, and performing steps 3 to 4 in Process Two for u from 1 to b;
- step 3: calculating $l=l^- - T_{1:u-1}^-$, and performing step 4 in Process Two for v from 1 to k and v≠u; and
- step 4: calculating $\hat{x}_v[t_{k-v+1,k-u+1}-t_{k-v+1,v}+1] \ominus \hat{x}_{k-u+1}[1]$, and substituting the calculation result with $\hat{x}_v[t_{k-v+1,k-u+1}-t_{k-v+1,v}+1]$ Process Three:
- step 1: adding 1 to $l^+$, and performing steps 2 to 3 in Process Three for u from 1 to k–d;
- step 2: calculating $l=l^+ - T_{1:u-1}^+$, and performing step 3 in Process Three for v from 1 to k and v≠u;
- step 3: calculating $\hat{x}_v[t_{k-v+1,ku}-t_{k-v+1,v}+1] \ominus \hat{x}_u[1]$, and substituting the calculation result with $\hat{x}_v[t_{k-v+1,u}-t_{k-v+1,v}+1]$;
- step 4: adding 1 to $l^-$, and performing steps 5 to 6 in Process Three for u from 1 to d;
- step 5: calculating $l=l^- - T_{1:u-}^-$, and performing step 6 in Process Three for v from 1 to k and v≠u;
- step 6: calculating $\hat{x}_v[t_{k-v+1,k-u+1}-t_{k-v+1,v}+1] \ominus \hat{x}_{k-u+1}[1]$, and substituting $\hat{x}_v[t_{k-v+1,k-u+1}-t_{k-v+1,v}+1]$ with the calculation result; and
- step 7: performing steps 1 to 6 in Process Three for L times.

The steps in the above three processes are performed to obtain the decoded k information vectors, thereby completing the decoding.

In some embodiments, decoding is performed using the bitonic elimination algorithm for (1≤v≤$k_p$) to obtain $x_{h_v}$. The complexity of this decoding method is $k_m k_p L + k_p(k_p-1)L = k_p(k-1)L$. That is, $$\frac{k_p}{k}(k-1)$$

times of XOR operations are required in decoding of data having one unit length. The complexity of this method is lower than that of the conventional decoding methods. Meanwhile, this decoding method may be local decoding, which eliminates an extra space overhead for decoding.

The decoding method according to the embodiments in the second aspect includes: acquiring each encoded block corresponding to each connection node, generating each decoding block, and performing bitonic decoding on the decoding blocks to generate information vectors, thereby completing the decoding. This decoding scheme reduces the computational complexity and the space overhead.

In a third aspect, the embodiments of the present application further provide an electronic device.

Figure 9:
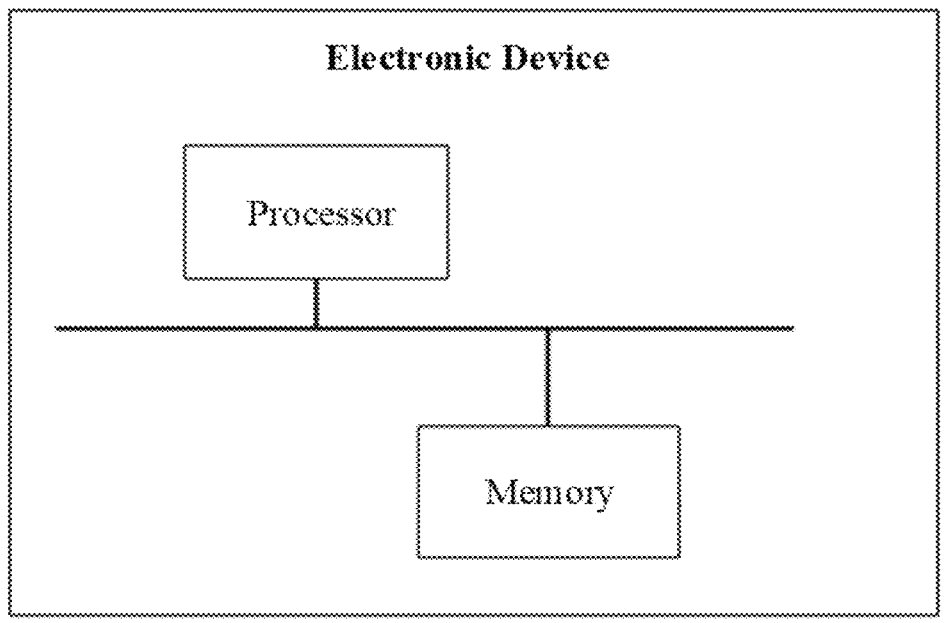
FIG. 9 shows an example of an electronic device including a processor and a memory provided by an embodiment of the present application.

In some embodiments, the electronic device (as shown in FIG. 9) includes a memory, a processor, and a computer program that is stored in the memory and executable on the processor, where the processor is configured to implement the encoding method according to any one of the embodiments in the first aspect of the present application or the decoding method according to any one of the embodiments in the second aspect of the present application when executing the computer program. The processor and the memory may be connected by a bus or other means.

The memory, as a non-transient computer-readable storage medium, may be configured to store a non-transient software program and a non-transient computer-executable program, e.g., the encoding method and the decoding method described in the embodiments of the present application. The processor is configured to implement the above encoding method and the decoding method by operating the non-transient software program and instructions stored in the memory.

The memory may include a program storage area and a data storage area. The program storage area may store application programs required by an operating system and at least one function. The data storage area may store a program that can perform the above encoding method and the decoding method. In addition, the memory may include a high-speed random access memory, and may further include a non-transient memory, such as at least one magnetic disk storage device, a flash memory device, or other non-transient solid-state storage devices. In some implementations, the memory optionally includes memories remotely provided with respect to the processor. These remote memories may be connected to the processor via a network. Examples of the above network includes, but is not limited to, the Internet, an intranet, a local area network, a mobile communication network, and combinations thereof. The non-transient software programs and instructions required to implement the encoding method and the decoding method are stored in the memory, and when executed by one or more processors, perform the encoding method mentioned in the embodiments of the first aspect and the decoding method mentioned in the embodiments of the second aspect.

In a fourth aspect, the embodiments of the present application further provide a computer-readable storage medium.

In some embodiments, the computer-readable storage medium stores a computer-executable instruction, where the computer-executable instruction is used to enable a computer to perform the encoding method according to any one of the embodiments in the first aspect of the present application or the decoding method according to any one of the embodiments in the second aspect of the present application.

Figure 10:
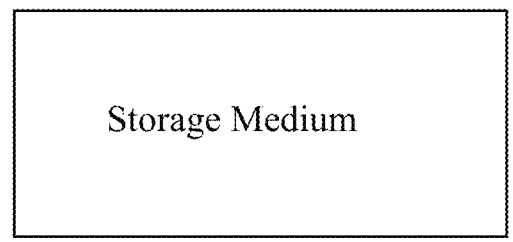
FIG. 10 shows an example of a storage medium provided by an embodiment of the present application.

In some embodiments, the storage medium as shown in FIG. 10 stores a computer-executable instruction therein, where the computer-executable instruction is performed by one or more control processors. For example, the computer-executable instruction is performed by one processor in the above electronic device, such that the one or more processors perform the above encoding method and the decoding method.

The device embodiments described above are merely illustrative, wherein the units described as separate components may or may not be physically separated, i.e., may be located in one place, or may also be distributed on a sequence of network units. Part or all of the modules can be selected according to actual needs to achieve the object of the schemes of the embodiments.

A person of ordinary skill in the art should understand that all or some of the steps in the methods and systems of the disclosure may be implemented as software, firmware, hardware and their appropriate combinations. Some physical components or all physical components can be implemented as software executed by processors, such as a central processing unit, a digital signal processor, or a microprocessor, or as hardware, or as integrated circuits, such as a specific integrated circuit. Such software may be distributed on the computer-readable medium, which may include a computer storage medium (or a non-transient medium) and a communication medium (or a transient medium). As is well known to those of ordinary skill in the art, the term "computer storage medium" includes volatile and nonvolatile, removable and non-removable mediums implemented by any method or technology for storing information (such as computer readable instructions, data structures, program modules or other data). The computer storage medium includes, but is not limited to, an RAM, an ROM, a flash memory or other memory techniques; a CD-ROM, a digital video disk (DVD) or other optical storage; a tape cartridge, a magnetic tape, a disk storage or other magnetic storage devices; or any other medium that may be configured to store desired information and may be accessed by a computer. In addition, as is well known to those of ordinary skill in the art, communication media usually contain computer-readable instructions, data structures, computer program modules, or other data in a modulated data signal such as a carrier wave or other transmission mechanisms, and may include any information delivery medium.

The embodiments of the present application are described in detail above with reference to the accompanying drawings. However, the present application is not limited to the above-mentioned embodiments, and various changes can be made without departing from the purpose of the present application within the scope of knowledge possessed by those of ordinary skill in the art. In addition, the embodiments in the present application and the features in the embodiments can be combined with each other if there is no conflict.

What is claimed is:

1. An encoding method for storing data in a distributed storage system, the storage system comprising a plurality of nodes each configured to store a respective one of a plurality of encoded blocks generated according to the stored data, the method comprising:
   acquiring original data to be stored in a storage system;
   acquiring a number of the plurality of nodes in the storage system as a first number;
   dividing the stored data into a second preset number of information vectors;
   generating an information matrix according to the first number and a the second preset number;
   generating a respective one of the second preset number of message blocks according to each of the second preset number of information vectors, and calculating a plurality of check blocks according to each information vector and the information matrix to obtain the plurality of encoded blocks, wherein each of the message blocks is identical with a respective one of the information vectors, and a number of check blocks is equal to the first number minus the second preset number; and
   storing the plurality of encoded blocks into the plurality of nodes respectively, wherein the system is configured to acquire the original data by accessing the second preset number of the plurality of encoded blocks in response to a data acquisition instruction.

2. The encoding method according to claim 1, wherein the information matrix comprises a multi-order first matrix; and correspondingly, the generating an information matrix according to the number of the nodes and a number of the information vectors comprises:
   generating the multi-order first matrix according to the number of the nodes and the number of the information vectors.

3. The encoding method according to claim 1, wherein the information matrix comprises a multi-order first matrix; and correspondingly, the calculating an encoded block according to each information vector and the information matrix to obtain a sequence of encoded blocks comprises:
   calculating an encoded block by multiplying each information vector with the first matrix to obtain the sequence of encoded blocks.

4. The encoding method according to claim 1, wherein the information matrix comprises a multi-order second matrix; and correspondingly, the generating an information matrix according to the number of the nodes and a number of the information vectors comprises:
   generating a multi-order identity matrix according to the number of the sequence of information vectors;
   generating a multi-order third matrix according to the number of the nodes and the number of the information vectors; and
   compounding the identity matrix and the third matrix to generate the multi-order second matrix.

5. The encoding method according to claim 1, wherein the information matrix comprises a multi-order second matrix; and correspondingly, the calculating an encoded block according to each information vector and the information matrix to obtain a sequence of encoded blocks comprises:
   calculating an encoded block by multiplying each information vector with the second matrix to obtain the sequence of encoded blocks.

6. A decoding method for encoded data stored in a distributed storage system, the encoded data including a plurality of encoded blocks generated by the encoding method according to claim 1, comprising:
   acquiring the second preset number of the plurality of encoded blocks stored in the first preset number of connection nodes in the system, in response to a data acquisition instruction;
   acquiring an encoded block corresponding to each connection node to obtain the sequence of encoded blocks;
   generating a decoding block according to each connection node and each encoded block to obtain a sequence of decoding blocks; and
   performing bitonic decoding on each decoding block to generate the information vectors.

7. The decoding method according to claim 6, wherein the connection nodes comprise node sequence numbers; and the generating a decoding block according to each connection node and each encoded block to obtain a sequence of decoding blocks comprises:
   sorting the sequence of connection nodes according to the node sequence numbers to obtain a sequence of sorted nodes; and
   generating decoding blocks according to the sequence numbers of the sequence of sorted nodes and the encoded blocks corresponding to the sorted nodes.

8. The decoding method according to claim 6, wherein the generating a decoding block according to each connection node and each encoded block to obtain a sequence of decoding blocks comprises:

transmitting each encoded block corresponding to each connection node to a user side; and acquiring a sequence of decoding blocks which are generated by the user side according to each encoded block corresponding to each connection node.

9. The decoding method according to claim 6, wherein the connection nodes comprise node sequence numbers; each connection node is a message node or a check node; each decoding block comprises each encoded block corresponding to each message node and each check block corresponding to each check node; and correspondingly, the generating a decoding block according to each connection node and each encoded block to obtain a sequence of decoding blocks comprises:

sorting the sequence of connection nodes according to the node sequence numbers to obtain a sequence of sorted nodes;

acquiring each encoded block corresponding to each message node;

generating a check block from each encoded block corresponding to each check node according to the sequence numbers of the sequence of check nodes in the sequence of sorted nodes; and transmitting each decoding block to the user side, and acquiring each new decoding block which is generated after the user side performs a local decoding operation according to each decoding block.

10. The decoding method according to claim 9, wherein each decoding block comprises each encoded block corresponding to each message node and each check block corresponding to each check node; and correspondingly, the generating each new decoding block by the user side by performing a local decoding operation according to each decoding block comprises:

performing, according to each encoded block corresponding to each message node, an XOR operation on each check block and each encoding bit, corresponding to each message node, in each encoded block, to generate each new decoding block.

11. The decoding method according to claim 6, wherein each connection node is a message node or a check node; each decoding block comprises each encoded block corresponding to each message node and each check block corresponding to each check node; and correspondingly, the generating a decoding block according to each connection node and each encoded block to obtain a sequence of decoding blocks comprises:

transmitting each encoded block corresponding to each connection node to the user side, and generating, by the user side, a decoding block from each encoded block corresponding to each check node according to each check node; and acquiring each new decoding block which is generated after the user side performs a local decoding operation according to each decoding block.

12. An electronic device, comprising a memory, a processor, and a computer program that is stored in the memory and executable on the processor, wherein the processor is configured to implement the decoding method according to claim 6 when executing the computer program.

13. A non-transitory computer-readable storage medium, which stores a computer-executable instruction, wherein the computer-executable instruction is used to enable a computer to perform the decoding method according to claim 6.

14. An electronic device, comprising a memory, a processor, and a computer program that is stored in the memory and executable on the processor, wherein the processor is configured to implement the encoding method according to claim 1 when executing the computer program.

15. A non-transitory computer-readable storage medium, which stores a computer-executable instruction, wherein the computer-executable instruction is used to enable a computer to perform the encoding method according to claim 1.

* * * * *